US 6,664,791 B2

(12) United States Patent
Thibedeau et al.

(10) Patent No.: US 6,664,791 B2
(45) Date of Patent: Dec. 16, 2003

(54) ALTERNATOR TESTER WITH IMPROVED HEAT DISSIPATION

(75) Inventors: Dennis G. Thibedeau, Franklin, WI (US); Richard J. Faehnrich, Arlington Heights, IL (US); Alejandro P. Brott, Chicago, IL (US); Alan D. Goetzelmann, Wheeling, IL (US); Paul A. Willems, Kenosha, WI (US)

(73) Assignee: Snap-On Technologies, Inc., Lincolnshire, IL (US)

( * ) Notice: Subject to any disclaimer, the term of this patent is extended or adjusted under 35 U.S.C. 154(b) by 0 days.

(21) Appl. No.: 10/314,160

(22) Filed: Dec. 9, 2002

(65) Prior Publication Data

US 2003/0117146 A1 Jun. 26, 2003

Related U.S. Application Data

(62) Division of application No. 09/888,382, filed on Jun. 26, 2001.
(60) Provisional application No. 60/214,254, filed on Jun. 26, 2000.

(51) Int. Cl.$^7$ ............................................. G01N 27/416
(52) U.S. Cl. ....................................................... 324/429
(58) Field of Search ................................ 361/676, 601, 361/679, 687, 688; 324/426, 429, 772

(56) References Cited

U.S. PATENT DOCUMENTS

| | | | |
|---|---|---|---|
| 3,848,181 A | 11/1974 | Hebert, Jr. et al. | ......... 324/29.5 |
| 3,907,398 A | 9/1975 | Hebert, Jr. et al. | ...... 339/112 L |
| 4,314,193 A | 2/1982 | Mortonson | ................... 322/28 |
| 4,315,204 A | 2/1982 | Sievers et al. | |
| 4,352,067 A | 9/1982 | Ottone | ....................... 324/434 |
| 4,377,786 A | 3/1983 | Paul et al. | ................... 324/426 |
| 4,379,990 A | 4/1983 | Sievers et al. | |
| 5,121,066 A | 6/1992 | Owski et al. | |
| 5,151,647 A | 9/1992 | Frantz | |
| 5,233,285 A | 8/1993 | Pierret et al. | |
| 5,254,952 A | 10/1993 | Salley et al. | |
| 5,257,463 A | 11/1993 | Wheeler et al. | ................. 34/20 |
| 5,424,588 A | 6/1995 | Cantor et al. | ................ 307/154 |
| 5,426,371 A | 6/1995 | Salley et al. | |
| 5,677,839 A | 10/1997 | Kondo | |
| 5,700,089 A | 12/1997 | McKinnon | |
| 5,701,089 A | 12/1997 | Perkins | ........................ 324/772 |
| 5,773,977 A | 6/1998 | Dougherty | ................... 324/429 |
| 5,811,976 A | 9/1998 | Fischer | |
| 5,899,947 A | 5/1999 | Hall et al. | |
| 6,064,186 A | 5/2000 | Pierret et al. | |
| 6,081,103 A | 6/2000 | Pierret | |
| 6,144,185 A | 11/2000 | Dougherty | ................... 320/132 |
| 6,166,523 A | 12/2000 | Singh et al. | |
| 6,166,548 A | 12/2000 | Winzer et al. | |
| 6,172,483 B1 | 1/2001 | Champlin | |
| 6,327,144 B1 * | 12/2001 | May | ........................... 361/687 |
| 6,331,762 B1 | 12/2001 | Bertness | |

FOREIGN PATENT DOCUMENTS

| | | |
|---|---|---|
| DE | 40 12248 A1 | 10/1991 |
| EP | 0591871 A | 4/1994 |
| EP | 0 733 791 A | 9/1996 |
| EP | 0865143 A | 9/1998 |
| FR | 2 574 187 | 6/1986 |
| GB | 2 073 464 A | 10/1981 |
| GB | 2 058 367 A | 4/1991 |

* cited by examiner

*Primary Examiner*—N. Le
*Assistant Examiner*—Amy He
(74) *Attorney, Agent, or Firm*—McDermott, Will & Emery

(57) ABSTRACT

An alternator tester having improved heat dissipation. The alternator tester has a housing and a circuit board including tester circuits. The housing has a size suitable to be held in one's hand. The housing includes a first compartment for receiving the circuit board and a second compartment for housing a load. The load is coupled to an alternator when the alternator tester conducts a test on the alternator. The second compartment has an opening disposed on one side and a fan disposed on the other side. The load, the opening and the fan are substantially in line. The opening and the fan form an air flow path, when the fan is in operation, the heat generated by the load is dissipated to the surrounding air and drawn out through the air path.

6 Claims, 4 Drawing Sheets

ALTERNATOR TESTER WITH IMPROVED HEAT DISSIPATION

RELATED APPLICATION

The present application is a division of Ser. No. 09/888,382, filed Jun. 26, 2001 and claims the benefit of priority from U.S. Provisional Patent Application Serial No. 60/214,254, entitled "AUTOMATIC ELECTRICAL SYSTEM TESTING APPARATUS AND METHODS," filed Jun. 26, 2000.

FIELD OF THE INVENTION

The present invention relates generally to alternator testers, and more specifically, to alternator testers with improved heat dissipation.

BACKGROUND OF THE INVENTION

An alternator converts mechanical motions into alternating current (AC) by electromagnetic induction. The alternating current is then passed through a rectifier assembly, such as a full-wave rectifier bridge comprising diodes, to convert the AC into DC to power other electrical systems. For example, an alternator in an automotive vehicle is driven by the engine to power the vehicle's electrical system, such as for charging the battery, powering headlights, and the like. The alternator output, however, is not perfectly smooth. The waveform of an alternator output is similar to a low-magnitude ripple riding on a DC component.

Alternator tests are conducted when alternators are under load, i.e., a load is coupled to the output terminals of the alternator to draw current therefrom. Alternator testers often have a set of probes or wires to couple to the output terminals of the alternator for detecting parameters of the alternator output, such as the output voltage, the ripple amplitude, the average current of the output, and so on. Usually, handheld alternator testers for testing vehicle alternators use a load capable of drawing up to 10 amperes of current. For alternators used in an automotive vehicle, the test of alternator under load may be conducted by turning on electrical accessories powered by the alternator, such as the head lights, radio, air conditioner, and the like.

Several problems may occur when testing alternators. First, since the ripple component of the alternator output is a small signal, the ripple waveform is subject to noise interference and may be difficult to observe. Second, when the load is coupled to the alternator, the alternator output waveform may not respond to, or does not always respond to the change of load immediately. Accordingly, the alternator output is unstable until a certain period of time has elapsed. If the tester determines alternator operation based on parameters collected from the unstable waveform, error in test results will occur. Third, using electrical accessories on a vehicle as a load draws inconsistent currents from the alternator. The alternator output level therefore tends to fluctuate, which makes precise test difficult. In addition, the load used in alternator tests generates a lot of heat, which causes safety concerns.

SUMMARY OF THE INVENTION

Accordingly, there exists a need for accurately determining the health of an alternator. There is another need to provide a stable load for use in alternator tests. Still another exists for evaluating the health of an alternator based on a stable alternator output. An additional need exists for providing high resolution signals for testing an alternator. There is still another need for dissipating heat generated by the load during the alternator test.

These and other needs are addressed by the alternator testers described in the present disclosure. An exemplary alternator tester provides high resolution signals and stable loads during alternator tests. According to one aspect of the disclosure, evaluation of the alternator operation is based on parameters collected after the load is coupled to the alternator for a predetermined period of time, so that the parameters reflect a stable alternator output. In another aspect, the load is coupled to the alternator for a very short period of time to reduce the heat generated during the test. In still another aspect, the load is housed in a handheld housing and capable of drawing large currents, for example, 50 amperes, from the alternator in order to produce better signal resolution.

An exemplary alternator tester according to the present disclosure couples a load to an alternator under test, evaluates the operation of the alternator based on parameters collected after the load has been coupled to the alternator for a first predetermined period of time.

In one aspect, the alternator may be driven by a motor, such as an engine powered by fossil fuels. According to one embodiment of the disclosure, the exemplary alternator tester detects motor speed or alternator speed. The load is applied to the alternator only after the motor speed or alternator speed reaches a predetermined level. In another aspect, the load is decoupled from the alternator after the load has been coupled to the alternator for a predetermined period of time.

An exemplary alternator tester of the present disclosure comprises a load, a terminal for receiving an alternator output signal representative of an alternator characteristic, and a switch device for selectively coupling the load to the alternator. A controller is configured for determining the characteristics of the alternator output signal and for generating a first switch operation signal to control the switch device to couple the load to the alternator. The controller determines the characteristics of the alternator output signal based on parameters collected after the load has been coupled to the alternator for a predetermined period of time.

According to one aspect of the disclosure, the alternator tester includes a housing having a size suitable to be held in one's hand. The alternator tester may further include a cooling device, such as a fan, for dissipating the heat generated by the load. The controller generates a second switch operation signal to control the switch device to decouple the load from the alternator after the load has been coupled to the alternator for a predetermined period of time.

Still other advantages and novel features of the present invention will be apparent from the following detailed description, simply by way of illustration of the invention and not limitation. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings in which like reference numerals refer to similar elements and in which.

DESCRIPTION OF THE PREFERRED EMBODIMENT

In the following description, for purpose of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
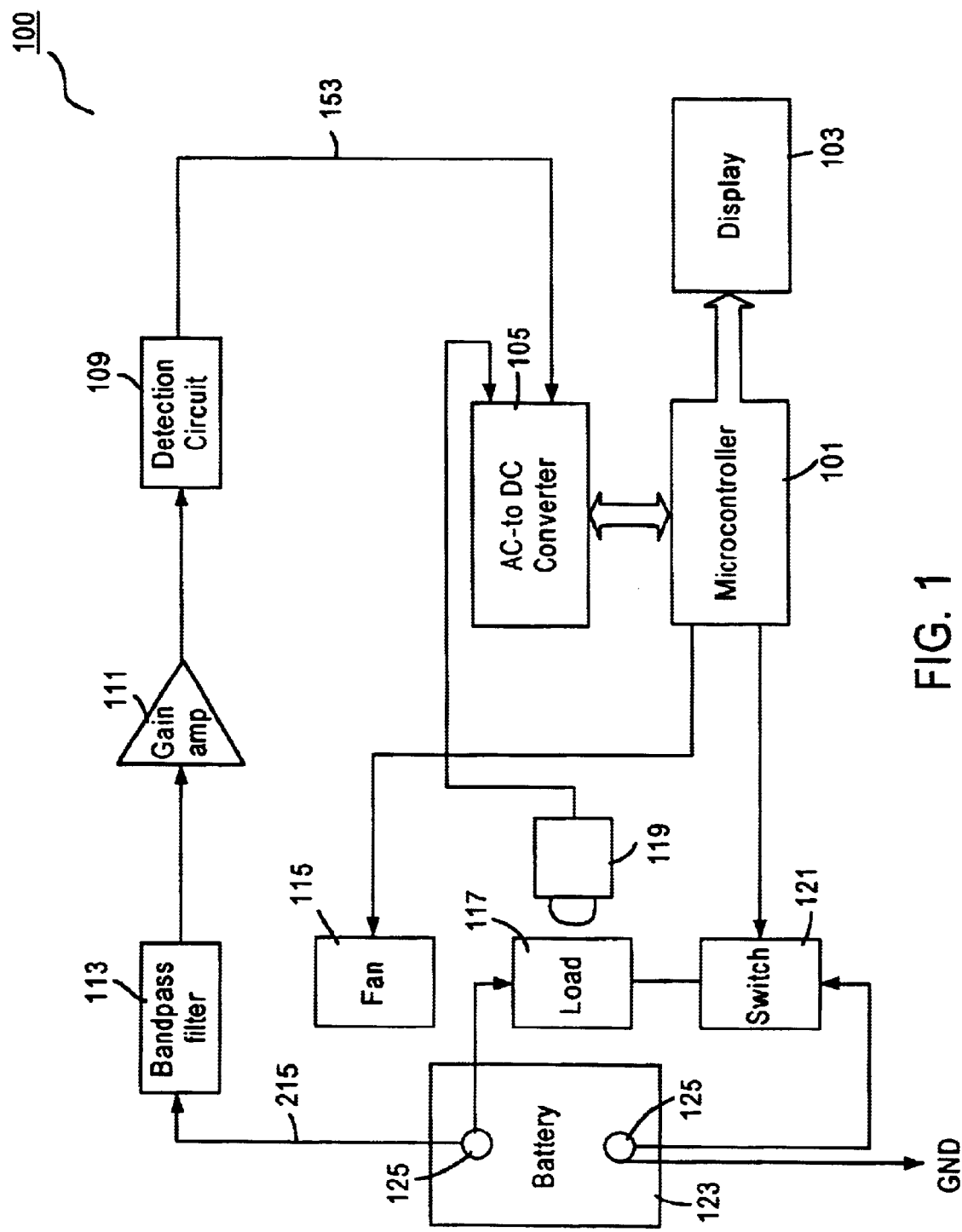
FIG. 1 shows a block diagram of an alternator testing system implemented according to the present invention.

FIG. 1 shows a block diagram of an alternator testing system 100 implemented according to the present invention. For purpose of illustration, the operation of the testing system is described with an alternator in an automotive vehicle. In an automotive vehicle, the alternator (not shown) is driven by the engine of the automotive vehicle to generate electricity. The output of the alternator is coupled to a battery 123 via a set of battery terminals 125 and charges the battery therefrom.

Testing system 100 may be a handheld device and may have terminals for receiving an alternator output signal 215 representative of the alternator output. The alternator output signal may be the electric current generated by the alternator charging battery 123. Alternatively, the alternator output signal may be a signal from a data processing system representative of the alternator output. The data processing system, for example, may be an on-board vehicle computer or other testing equipment. In another aspect, the alternator output signal may be a signal generated by a wireless transmission assembly that transmits signals representative of alternator characteristics wirelessly.

Testing system 100 has a microcontroller 101, an analog-to-digital converter 105 and a display 103. Microcontroller 101 processes data and generates control signals. Analog-to-digital converter 105 converts analog signals to digital signals. Display 103 provides a communication interface with a user and may be an LCD screen, an LED indicator or the like. Microcontroller 101 may control a switch device 121, such as an FET switch, that selectively couples a load 117 to the alternator. As illustrated in FIG. 1, switch device 121 and load 117 are serially connected and then coupled to the alternator in parallel via battery terminals 125. If switch device 121 is on, load 117 is coupled to the alternator; if switch device 121 is off, load 117 is decoupled from the alternator. Other circuit design techniques known to persons skilled in the art can be used for controlling the coupling of the load to the alternator.

Load 117 may be any component that is capable of drawing large currents from the alternator, while maintaining small voltage across it, for example, a Nichrome wire wound into a coil. As an example, load 117 may be a Nichrome coil that draws 50 amperes of current from the alternator. A Nichrome coil load is advantageous due to its ability to handle a substantial amount of current, while maintaining compact sizing. A cooling device 115, such as a cooling fan, controlled by microcontroller 101, may be provided to help dissipate heat generated by load 117.

While the alternator test may be conducted at any alternator speed or engine speed, the engine may be driven to a stable engine speed, such as 1500 rpm or above, to ensure the alternator generates a stable alternator output signal. As an alternative, the test may be conducted at idle engine speed. A user may indicate to the system that the engine speed has reached a certain level by observing readings from a tachometer. Alternatively, experienced users may be able to determine the engine speed based on the audible noise generated by the engine. According to an embodiment, the system may receive a signal representing an engine speed or an alternator speed from other data processing systems, such as a vehicle computer or other testing equipment or the like. The signal representing the engine speed or the alternator speed may be fed to, and processed by, microcontroller 101.

Upon the engine speed or the alternator speed reaching a predetermined level, such as 1500 rpm for the engine speed, microcontroller 101 generates a first switch control signal to turn on switch 121 so that load 117 is coupled to the alternator via battery terminals 125. The alternator is now operating under load.

Alternator output signal 151 may first pass through a bandpass filter 113 in order to eliminate harmonics as well as noise picked up at battery terminals 125. Bandpass filter 113 may have a pass band between 100 Hz and 4 kHz. Alternator output signal 151 may then pass through an amplifier 111 to amplify signal level.

Alternator output signal 151 is then fed to a detection circuit 109. Detection circuit 109 generates a parameter signal 153 representative of parameters of the alternator output signal 151, such as ripple amplitude, voltage level and the like. This current may use conventional filtering and load detection to produce the desired alternator parameters. Copending non-provisional patent application Ser. No. 09/888,385, filed concurrently herewith and titled "Alternator Testing Method and System Using Ripple Detection," by the same inventors and commonly assigned, describes a particular ripple detection circuit and methodology that could be implemented. The disclosure incorporated herein by reference. The parameters are used by microcontroller 101 to determine the characteristics of the alternator. Techniques using parameters of alternator output signals to determine alternator operation are described in U.S. Pat. Nos. 3,629,704, 4,459,548, and 4,315,204, incorporated herein by reference. Parameter signal 153 is next sent to analog-to-digital converter 105 and then into microconitroller 101.

According to one embodiment of the invention, although parameters of alternator output signal 151 may be available upon load 117 coupling to the alternator via battery terminals 125, microcontroller 101 will evaluate the alternator health based on parameters picked up only after load 117 has been coupled to the alternator for a predetermined period of time, such as 0.75 second. The predetermined period of time, chosen to occur when the alternator output signal is stable, may be set empirically based on parameters like alternator model, alternator rating, types of load.

In another aspect of the invention, after load 117 has been coupled to the alternator for a predetermined period of time, for example, one second, microcontroller 101 will issue a second switch control signal to turn off switch device 121, which in turn decouples load 117 from the alternator. Since load 117 is coupled to the alternator for a short period of time, heat generated by the current passing load 117 is minimal. The predetermined period of time is chosen at a point of time before the load becomes too hot due to the current passing through it. The predetermined period of time may be empirically set based on parameters like the threshold temperature, alternator model, alternator rating, types of load.

A cooling device 115, such as a fan, controlled by microcontroller 101, may be implemented to help dissipate the heat generated by load 117. Testing system 100 may have a temperature sensor 119 disposed near load 117 for generating a temperature signal to microcontroller 101 indicating the temperature near or at load 117. Based on the detected temperature, microcontroller 101 controls the operation of cooling device 115: if the temperature is higher than a predetermined temperature, such as 70° C., microcontroller 101 issues a signal to turn on cooling device 115; if the temperature is lower than the predetermined temperature, microcontroller 101 issues a signal to turn off cooling device 115.

Figure 2:
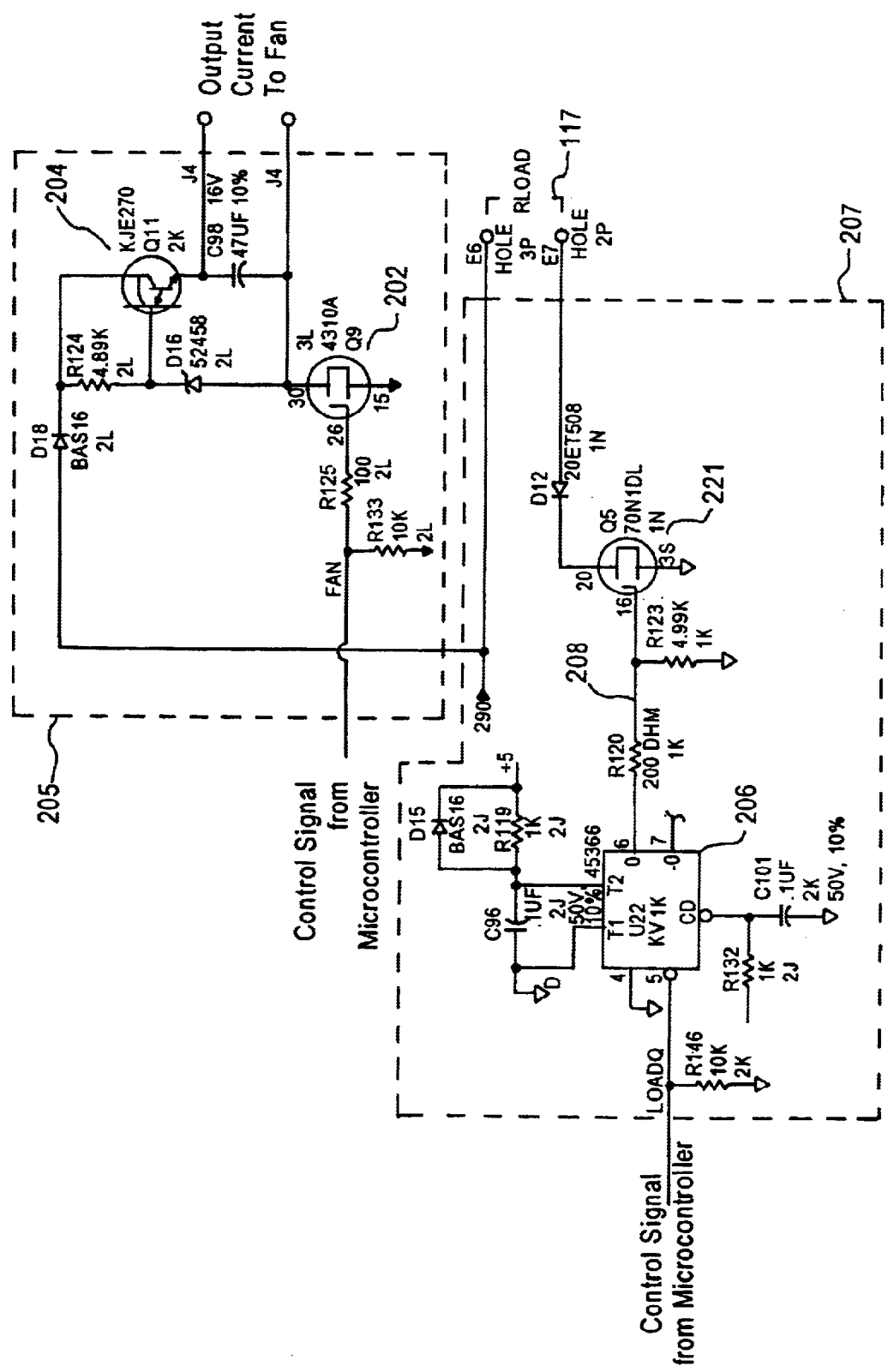
FIG. 2 shows an exemplary circuit of components used in an alternator testing system implemented according to the present invention.

FIG. 2 shows an example of a control circuit 207 for coupling load 117 to the alternator and a regulation circuit 205 for controlling operation of a fan for purpose of cooling. Control circuit 207 includes a logic IC 206 that receives a control signal from microcontroller 101 and in response generates a switch control signal 208 to control the ON/OFF of a FET switch 221 which in turn controls the coupling of load 117 to the alternator.

Regulation circuit 205 controls the operation of a fan. A transistor 204 regulates the voltage to the fan. The fan couples to the power source through a FET switch 202, which is controlled by a control signal generated by microcontroller 101. The FET switch 202, in response to the content of the control signal, turns on or off the power to the fan. When the temperature at load 117 is too high, microcontroller generates a control signal to control FET switch 202 to couple the fan to the power source and turns on the fan. If, the temperature of load 117 drops below a predetermined temperature, microcontroller 101 generates another control signal to control the FET switch 202 to turn off the power of the fan.

Figure 3:
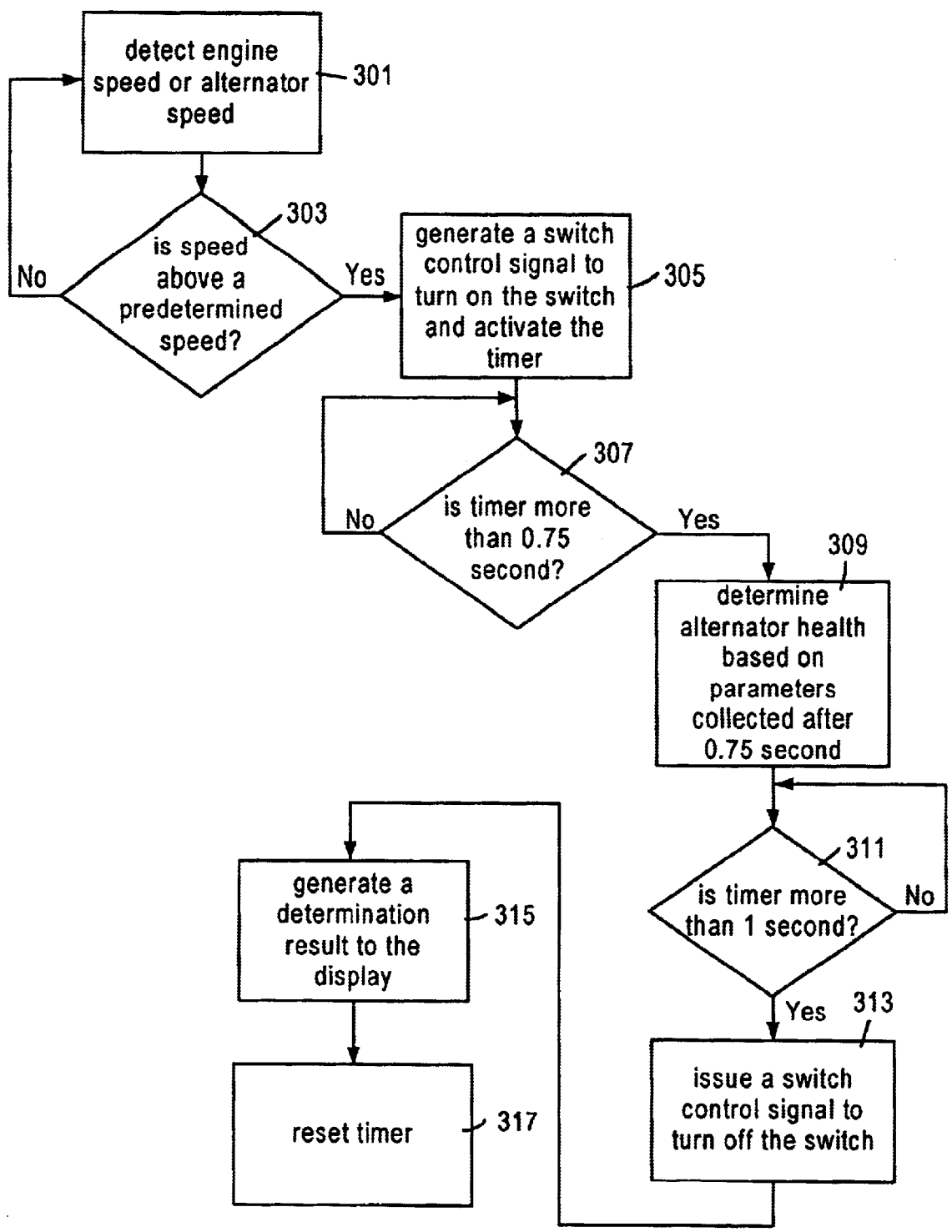
FIG. 3 shows a flow chart illustrating the testing procedure carried out by an alternator testing system implemented according to the present invention.

FIG. 3 shows a flow chart illustrating the testing procedure carried out by an alternator testing system implemented according to the present invention. At steps 301 and 303, microcontroller 101 determines whether the engine speed or alternator speed has reached a predetermined speed. If not, microcontroller continues the determination. If yes, microcontroller 101 generates a switch control signal to turn on the switch and couple the load to the alternator. Microcontroller 101 also turns on a timer (Step 305). At step 307, microcontroller 101 reads the timer and determines if the load has been coupled to the alternator for more than 0.75 second. If not, microcontroller 101 continues the determination; otherwise, microcontroller 101 starts to determine the health of the alternator based on parameters of the alternator output signal collected after 0.75 second (step 309). Then microcontroller 101 determines if the load has been coupled to the alternator for more than 1 second (step 311). If not, microcontroller 101 continues the determination; otherwise, microcontroller 101 issues a switch control signal to turn off the switch and decouple the load from the alternator (Step 313). Microcontroller 101 then generates a determination result to the display and resets the timer (steps 315 and 317).

Figure 4:
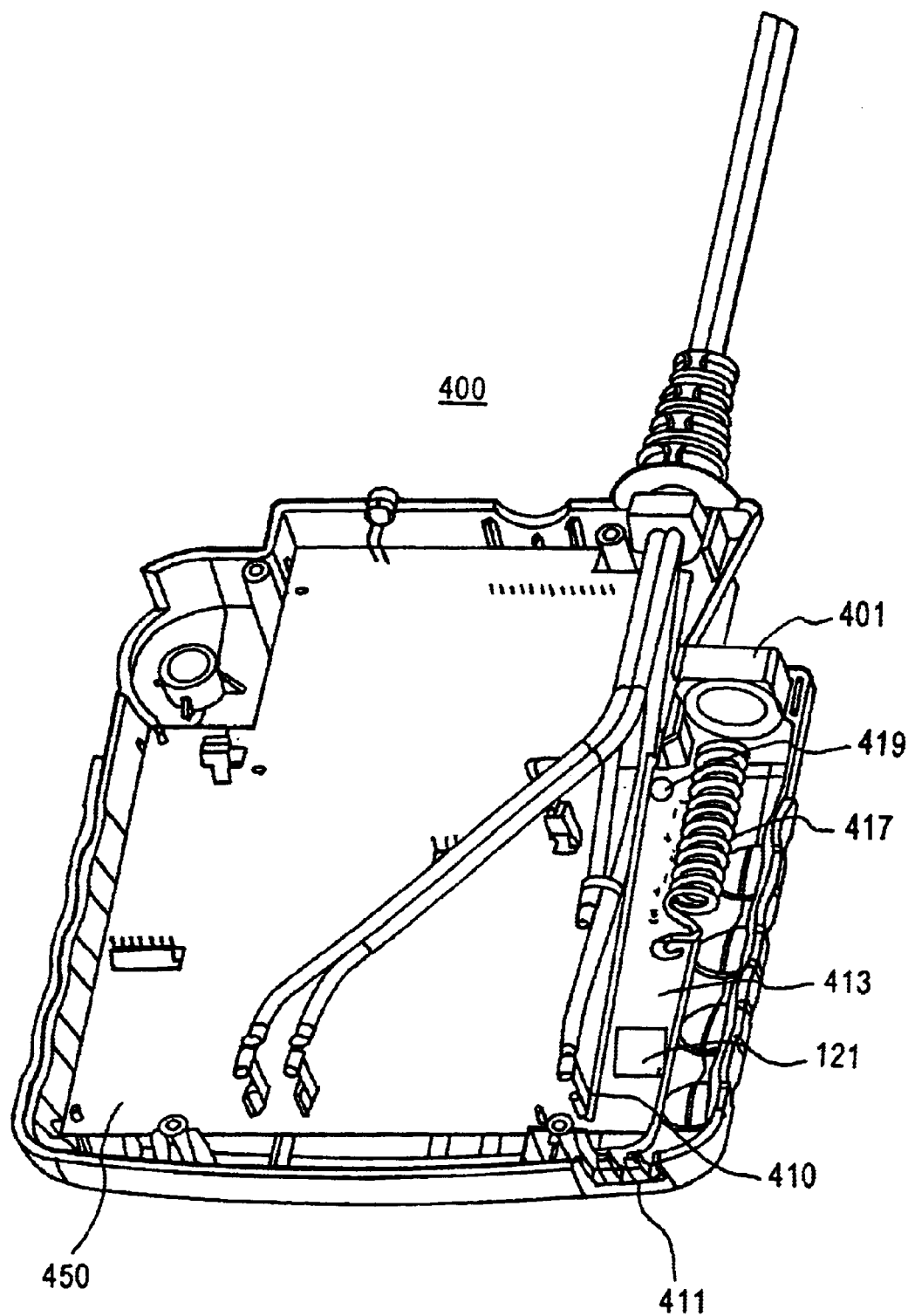
FIG. 4 shows an example of the cooling arrangement implemented according to the present invention.

FIG. 4 shows an example of the cooling arrangement implemented according to the present invention, with part of a housing 400. Housing 400 has a size suitable to be held in one's hand and receives a circuit board 450 having microcontroller 101, detection circuit 109, bandpass filter 113, amplifier 111 and other components. A temperature sensor 419 is disposed at a location near a Nichrome coil 417, as the load sensing element. Switch 121, that may be an FET-type switch, is in serial connection with coil 417. An air inlet 411 is disposed on one side of the housing and a fan 401 is disposed on the other side of the housing, so that a linear channel 413 between air inlet 411 and fan 401 forms an air flow path when fan 401 is in operation. The channel is defined by a wall 410 that isolates the airflow path from the remainders of the housing. The heat generated by coil 417 will be dissipated to the surrounding air and drawn out from the housing 400 through an outlet established by fan 401 itself, as depicted.

The embodiments described above may be used with any desired system or engine. Those systems or engines may comprise items utilizing fossil fuels, such as gasoline, natural gas, propane and the like, wind and hybrids or combinations thereof Those systems or engines may be incorporated into other systems, such as an automobile, a truck, a boat or ship, a motorcycle, a generator, an airplane and the like. The embodiments may include or be utilized with any appropriate voltage level, such as about 12 Volts, about 42 Volts and the like.

While this invention has been described in connection with an exemplary embodiment, it is to be understood that the invention is not limited to the disclosed embodiment, but on the contrary, is intended to cover various modifications and equivalent arrangements included within the spirit and scope of the appended claims.

What is claimed is:

1. An alternator tester comprising:
   a circuit board including tester circuits, and
   a housing including:
      a first compartment for receiving the circuit board;
      a second compartment for housing a load, wherein the load is coupled to an alternator when the alternator tester conducts a test on the alternator;
      an opening disposed on one side of the second compartment;
      a fan disposed on the other side of the second compartment; and
   wherein the load, the opening, and the fan are substantially in line,
   the opening and the fan forming an air flow path, and when the fan is in operation, the heat generated by the load being dissipated to the surrounding air and drawn out through the air path, and
   the housing is of a size suitable to be held in one's hand.

2. The alternator tester of claim 1, wherein the tester evaluates the operation of the alternator by:
   coupling the load to the alternator; and
   detecting characteristics of an alternator output signal representative of an alternator characteristic only after the load has been coupled to the alternator for a first predetermined period of time.

3. The alternator tester of claim 2, wherein the tester evaluates the operation of the alternator by decoupling the load from the alternator after the load has been coupled to the alternator for a second predetermined period of time greater than the first predetermined period of time.

4. The alternator tester of claim 1, wherein the tester has a terminal for receiving an alternator output signal representative of an alternator characteristic; a controller, disposed on the circuit board, for determining characteristics of the alternator output signal and for generating a first switch operation signal to control a switch device to couple the load to the alternator; and the controller determines the characteristics of the alternator output signal based on parameters collected only after the load has been coupled to the alternator for a first predetermined period of time.

5. The alternator tester of claim 4, wherein the controller generates a second switch operation signal to control the switch device to decouple the load from the alternator after the load has been coupled to the alternator for a second predetermined period of time.

6. The alternator tester of claim 5, wherein the second compartment further houses a temperature sensor, disposed at a location near the load and coupled to the controller, for generating a temperature signal indicating the temperature in the second compartment, and a switch for coupling the load to the alternator, the controller generates a control signal for turning on the fan in response to the temperature signal indicating a temperature greater than a predetermined value.

\* \* \* \* \*